United States Patent [19]

Swanson

[11] Patent Number: 4,697,182

[45] Date of Patent: Sep. 29, 1987

[54] METHOD OF AND SYSTEM FOR ACCUMULATING VERIFIABLE ENERGY DEMAND DATA FROM REMOTE ELECTRICITY METERS

[75] Inventor: Scott C. Swanson, Roswell, Ga.

[73] Assignee: Sangamo Weston, Inc., Norcross, Ga.

[21] Appl. No.: 849,899

[22] Filed: Apr. 9, 1986

Related U.S. Application Data

[63] Continuation-in-part of Ser. No. 776,719, Sep. 16, 1985, Pat. No. 4,639,728.

[51] Int. Cl.$^4$ .............................................. G08C 19/16
[52] U.S. Cl. .......................... 340/870.02; 340/310 A
[58] Field of Search ............. 340/310 A, 870.3, 870.2, 340/637; 179/2 AM; 364/483; 324/433; 307/66

[56] References Cited

U.S. PATENT DOCUMENTS 3,114,900 12/1963 Anderson ..................... 340/870.03
4,085,287 4/1978 Kullmann et al. .......... 340/870.02 X
4,504,831 3/1985 Jahr et al. ..................... 340/870.03

Primary Examiner—Jerry W. Myracle
Attorney, Agent, or Firm—Dale Gaudier

[57] ABSTRACT

A solid state electricity demand recorder (10) is controlled by a programmable microprocessor (38) to obtain energy demand survey and billing data. The accumulated count of pulses during a record interval is compared with an encoded register reading obtained from an electricity meter (30) at the end of the record. If there is acceptable correlation between the accumulated count and encoded meter reading, the interval pulse counts associated with that record are deemed verified. Power for the recorder (10) is obtained from the power line, except during power outages in which case a battery (28) provides back-up power. Error conditions such as power outages, meter failure, and low battery condition are automatically detected and communicated to the central computer for remedial action by the electrical utility.

20 Claims, 15 Drawing Figures

| PREAMBLE | TIME / IDENT. | DIAL-UP | TEST | INTERVAL DATA | LOAD CONTROL REAL TIME / CLOCKED LOAD | ERROR CONDITION |
Fig. 3
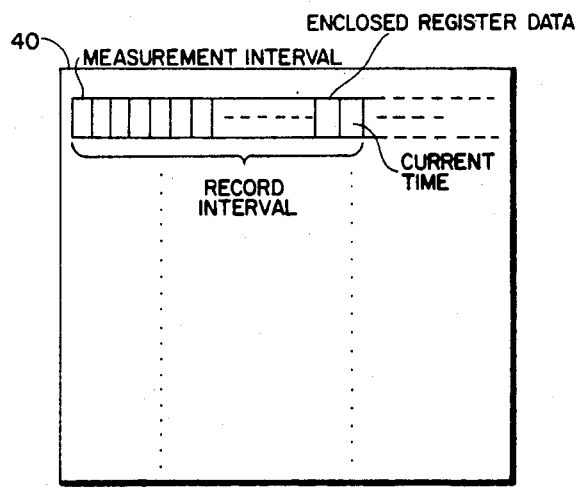
Fig. 4
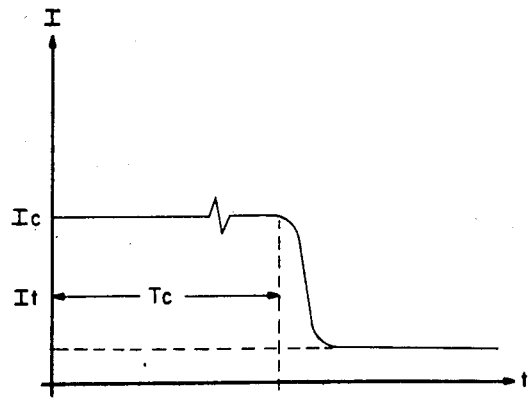
Fig. 7

LOW BATTERY DETECT

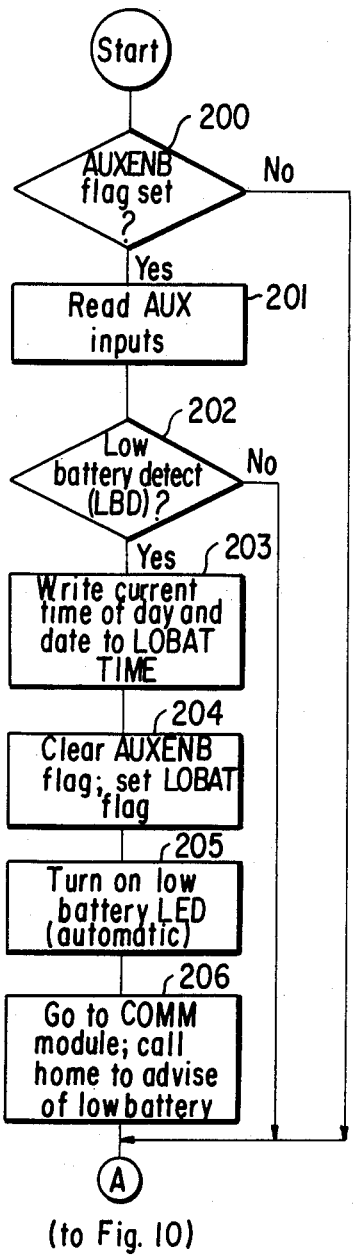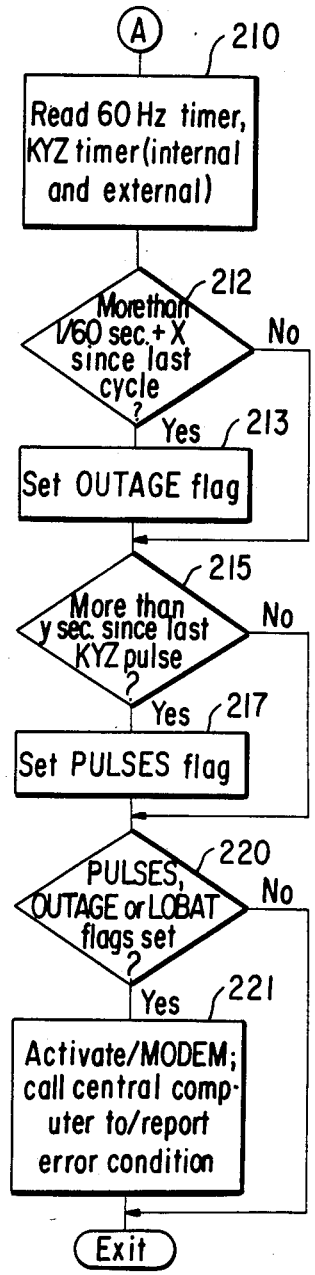

(NO ANSWER OVERRIDE Routine)

Programmable Divider Routine

METHOD OF AND SYSTEM FOR ACCUMULATING VERIFIABLE ENERGY DEMAND DATA FROM REMOTE ELECTRICITY METERS

CROSS REFERENCE TO RELATED APPLICATION

This application is a continuation-in-part of application Ser. No. 776,719 filed Sept. 16, 1985, now U.S. Pat. No. 4,639,728.

TECHNICAL FIELD

The invention relates generally to electricity meter data collection, and, more particularly, toward methods and apparatus for collecting verifiable remote electricity meter data for surveying energy consumption and for customer billing.

BACKGROUND ART

Electricity and other forms of energy are billed in accordance with energy consumption that may vary with the size of the customer and the time of day. Since the peak amount of energy consumed by a customer over a given time period (so-called "demand") determines the size of the service required, e.g. size of conductors, transformers, peak generating capacity, etc., many utilities measure this peak consumption or demand to determine the rate to be charged the customer for all electricity consumed over a given period.

To determine the amount of energy being consumed by each customer during successive demand intervals, utility companies have located, at customer sites, electricity meters, such as watthour meters containing a demand register, which must periodically be read either by the customer or by a representative of the utility, to accumulate billing data (e.g. peak demand the total energy consumed). In addition, to evaluate customer energy demand so as to assess the capability of the utility's equipment to satisfy demand, or to justify rate modification, energy demand occasionally must be surveyed over an extended period of time, e.g. 18 months.

Electrical demand is typically measured by the use of a pulse initiator which utilizes a photo-optical detector to detect the rotation of the eddy-disk of a watt-hour meter and produces a series of pulses whose frequency is directly related to the instantaneous power (demand) being delivered to the customer.

Typically, a demand register accumulates these pulses over a preselected interval, e.g. 15 minutes, to give an indication of the peak demand over the interval. This peak demand data is then stored in a memory device for subsequent readout or display.

Since there will often be large numbers of meters registering demand throughout a utility system there exists a need to monitor electrical demand simultaneously at a large number of individual customer sites, and to process the data at a central location. This is commonly done by means of a mainframe computer operated by the utility company. This information is used by the utility to assess demand parameters such as peak demand and seasonal as well as daily demand variations. Accordingly, systems have been developed for polling customer meters to extract and transmit energy demand data over commercial telephone lines to the central computer for accumulation and processing.

Because the investment required to provide automatic polling of remote meter registers at the customer site is substantial, as an alternative, automatic meter data recorders have been developed that are set up at customer sites to be monitored. The data recorders commonly employ magnetic tape storage techniques to record pulses generated by the pulse initiator of the meter that represent electrical demand during successive intervals. The magnetic tape is then carried to the utility for processing.

Magnetic tape recorders of the type employed for this purpose are relatively complex, require substantial battery power to operate in the event of a power failure and may fail to work properly in environments exposed to temperature extremes. Recently, due in part to availability of inexpensive solid state memory devices, portable meter reading devices having solid state memories have been developed for accumulating demand data stored in a meter. The reading device is then either brought to the central computer and the data transmitted directly to the computer, or the data is transmitted over telephone lines to the central computer. There is a tendency, however, for errors to occur in the acquisition and transmission of data. These errors are caused by among other things failures of the solid state memory, misdetection of pulses generated by the electricity meter and, most commonly, electrical noise contamination. Data acquisition errors are particularly troublesome because they affect, among other things, the accuracy of customer billing. For this reason there currently exists a significant need to verify energy demand data accumulated from customer meters to ensure that the data is accurate. Also, since peak demand data must be correlated with the time of day, day-of-week, season, etc. for proper billing purposes, it is necessary that such a data acquisition device be capable of operation despite power outages occurring on the power line.

In systems which employ battery back-up power supplies for operation in the event of a power failure, there exists a need for determining when the battery has grown weak and requires replacement. Problems can occur in accumulating and maintaining verifiable energy demand data if the battery back-up system fails to provide a reliable alternative source of power during power outages. If the back-up battery has become marginal or failed (especially during periods of frequent outages), the recorded customer demand data may be erroneous or suspect. Yet, the utility has no way of determining when the back-up battery failed so as to estimate the beginning of the suspect data. Prior to the present invention, there has been no known way to accurately monitor the performance of battery back-up systems short of regular planned replacement at periodic intervals in accordance with known statistical replacement techniques, or periodic on-site testing of the batteries at the customers' facilities.

Other problems have been encountered in conventional remote meter data recorders which transmit energy demand data over commercial telephone lines to a central computer for processing. Because of this preexisting communications link for meter data collection, it would be economically advantageous to use the same equipment for energy management functions, such as where customer loads are interrupted during periods of peak demand. However, some prior art data recorders are configured to transmit the energy demand data to the central computer only at predetermined times. These predetermined times are usually selected when a customer's telephone line is not likely to be in use, e.g.

during the late night hours. This type of prior art data recorder can receive command information from the central computer over the telephone line only after the recorder has initiated the communication by dialing up the central computer to download its data. Systems which can receive commands only during recorder-initiated communication modes are not receptive to receipt of commands at any time other than when communication has been initiated by the recorder, and are therefore unable to provide energy management functions.

Still other problems have been encountered in data recorder systems which are receptive to commands only after initiation of a communication by the meter for the purpose of downloading data. In particular, there exists a need for detection of error conditions such as power outages, low battery condition, or a malfunction in the meter. Conventional meters and recorders which are unable to provide indications of error conditions have proven unsatisfactory to electrical utilities which need to be able to monitor and correct error conditions rapidly and to perform peak load energy management functions.

One object of the invention, therefore, is to provide a method of and system for verifying data accumulated from remote electricity meters during successive demand intervals and to confirm that the data measured represents data upon which a utility company or other controlling institution can rely.

Another object is to provide a relatively inexpensive and reliable device for making energy demand measurements and verifying their reliability at customer meter sites for the purpose of obtaining demand survey and customer billing data. A further object is to provide an electricity demand data acquisition device which operates reliably even during a power outage.

Another object of the present invention is to provide an electricity demand acquisition device which initiates a communication to a central computer in the event of an error condition such as a power outage, low battery condition, or malfunction in the metering device.

It is another object of the present invention to provide an electricity demand data acquisition device which is operative to override the conventional data downloading operational sequence (which occurs at a predetermined time) and receive communications initiated by the utility central computer.

It is another object of the present invention to provide an electricity demand data acquisition device which may be configured for operation over a wide range of utility customer demands by scaling the KYZ pulse input.

It is another object of the present invention to provide an electricity demand data acquisition device which maintains an indication of the time of day and date of the occurrence of a low battery condition so that an estimation of the reliability of the data stored in the device can be made.

DISCLOSURE OF THE INVENTION

A system for accumulating verifiable energy demand data from a remote electricity meter, in accordance with the invention, comprises means for detecting and counting pulses generated by the remote electricity meter which are indicative of energy consumption at the customer site during successive time intervals. The pulse count during intervals is stored in a solid state memory means. A predetermined number of successive time intervals constitutes a record. Also stored in the memory means at the end of each record is an encoded representation of the then current meter register reading, i.e., the energy demand accumulated up through the current record interval. With the interval pulse counts and encoded register readings stored in different addressable locations of the memory means, the interval pulse counts contained in each record can be readily verified by accumulating the total number of counts over a measuring period for comparison with the encoded register reading.

In accordance with another aspect of the invention, means are provided at either the customer site or central computer for accumulating the pulse counts obtained during the successive intervals of a record, and converting the accumulated pulse counts into accumulated energy consumption data. At the end of each record, the energy demand corresponding to the accumulated pulse count is compared with an encoded meter reading to verify that the interval pulse counts are reliable.

The output of the solid state memory as well as of the register encoder can be transmitted optically (e.g. over an optical link) or electrically to a portable data storage device or transmitted directly to a central computer (e.g. over a telephone line).

The system preferably comprises microprocessor based circuitry contained either in the electricity meter or in a separate housing. The microprocessor is controlled by a stored program and data accumulated from the meter are stored in a solid state memory.

To ensure reliable operation in the event of a power outage, a battery backup power supply is also provided. In accordance with a further aspect of the invention, the battery is recharged as needed under control of the same microprocessor that controls meter data acquisition. An additional object of the invention, therefore, is to provide a microprocessor controller system, compatible with data acquisition, for battery recharging.

In accordance with a further aspect of the invention, the electricity demand meter and data recorder according to a disclosed alternative embodiment includes circuitry for detecting the condition of an error condition such as a low battery condition, a power outage, or the failure of the electricity meter. In particular, the circuitry for detecting the low battery condition stores the time of day and date of occurrence of the low battery condition in the solid state memory. During a communication to the central computer, initiated in response to the detection of the error condition or initiated by the central computer, data corresponding to the time of day and date of occurrence of low battery condition is communicated to the central computer so that an estimation of the accuracy of downloaded demand data can be made. Advantageously, information relating to the number of power outages, the length between outages, and the time of occurrence of the low battery condition helps the utility establish an assurance level of the accuracy of the data.

In accordance with yet a further aspect of the invention, the electricity demand meter and data recorder according to the present invention includes means for initiating a communication to the central computer in the event of the detection of an error condition. Additionally, the disclosed alternative embodiment is operative to respond to a utility central-computer initiated communication over the telephone line for receipt of command data, which had heretofore not been possible in systems which were configured to initiate communications only at predetermined times.

An additional object of the present invention is to provide an electricity demand meter which is operable over a wide range of customer demands. This is accomplished in the disclosed embodiment by scaling the KYZ input pulses received from the meter circuitry so that the demand meter memory does not overflow yet still maintains an accurate record of the electricity demand of the customer. Advantageously, therefore, the demand meter according to the disclosed alternative embodiment may be employed at a customer site which initially has low power usage and then increases over time due to growth or expansion of the customer, without the need for replacement of the electricity demand meter equipment. Reconfiguration of meter to accommodate higher KYZ pulse frequencies is accomplished by transmitting command information to the meter to scale the input and accumulate encoded representations of customer demand data.

BRIEF DESCRIPTION OF THE DRAWING FIGURES

The foregoing objects and advantages of the present invention will be more clearly understood when considered in conjunction with the following description of the preferred embodiments of the invention, when taken in conjunction with the drawing figures, wherein:

FIG. 3 is a diagram of the data protocol used to transmit data between the microprocess or of FIG. 2 and a central computer;

FIG. 4 is a schematic representation of data mapped into the random access memory of FIG. 2;

FIG. 7 is a graph of battery charging current as a function of time developed by the software of FIG. 6c;

FIG. 9 is a simplified flow chart of software for detecting a low battery error condition;

FIG. 10 is a simplified flow chart of the software for initiating a communication to the utility central computer in response to detection of an error condition;

BEST MODE FOR PRACTICING THE INVENTION

Figure 1A:
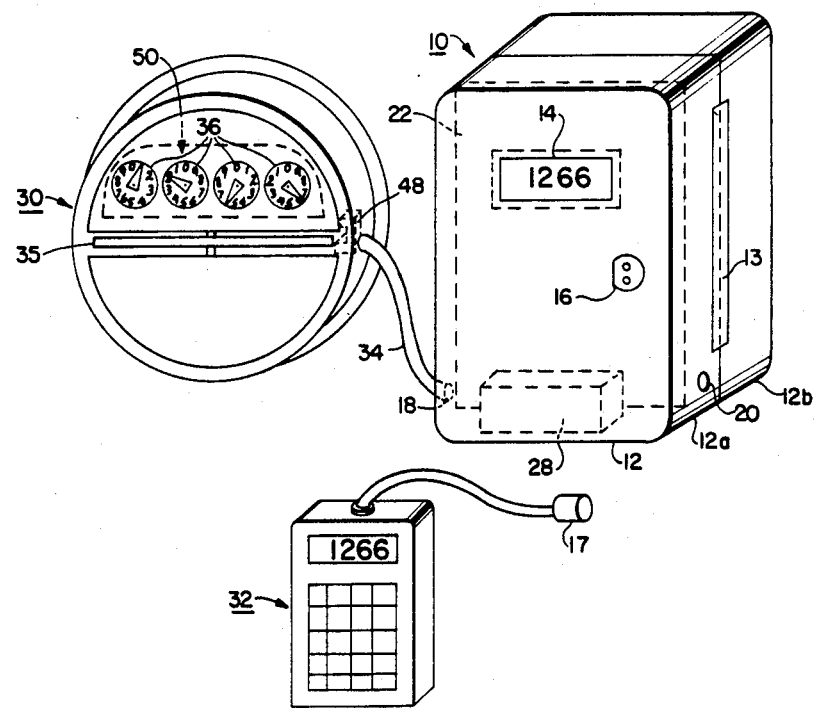
FIG. 1a is a perspective view of one embodiment of a solid state data recorder, in accordance with the invention, wired to a remote electricity meter.

Referring to FIG. 1a, a solid state data acquisition unit 10, in accordance with the principles of the invention to be hereinafter described, comprises a housing 12 having a display 14, and an optical port 16 as well as hard-wired ports 18 and 20. Within housing 12 is a circuit board 22 containing microprocessor circuitry to be hereinafter described, display driver circuitry and optical data transmission interface circuitry. The circuitry contained on board 22 normally is powered through a conventional power supply which derives its power from the electrical power line or mains (not shown). As described more fully below, board 22 also contains circuitry 28 for charging a rechargeable battery and for detecting a low battery condition indicative of imminent battery failure. Battery circuitry 28 is used to supply power to the circuitry on board 22 when a power outage occurs or the electrical mains supply is otherwise interrupted.

Recorder 10 is adapted to receive and record energy demand measured by an electricity meter 30 at a customer site, to format the data and, ultimately, transmit the data from port 20 to a central computer over commercial telephone lines or transmit the data from optical port 16 via an optical coupler 17 attached to a portable data retriever/recorder 32, such as the TELXON model 790, made by Telxon Corp. The data accumulated by the recorder 10 is formatted into demand levels during successive predetermined fixed time intervals, e.g. fifteen minute intervals. A predetermined number of successive intervals, e.g. sixty intervals, constitutes a record.

Recorder 10 is coupled via port 18 to meter 30 over wires 34 which carry energy demand pulses generated by a standard pulse initiator, such as shown in U.S. Pat. No. 4,321,531, synchronized to the rotating eddy-disk 35 of the meter. Also transmitted to recorder 10 over wires 34 are digitally encoded data representative of the analog reading of meter register 36. For brevity, and because the structure and operation of the pulse initiator and register encoder within the meter 30 are well known to those skilled in the art, details of the initiator and encoder are not described herein.

Figure 1B:
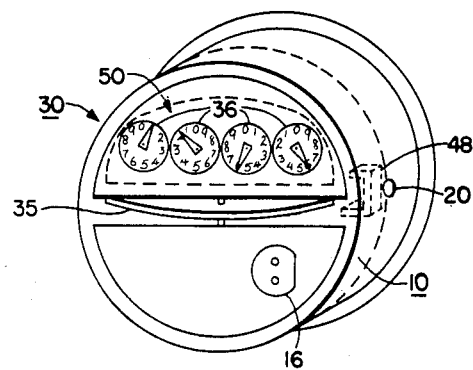
FIG. 1b is a view of another embodiment wherein the data recorder is provided inside the meter.

In FIG. 1b, recorder 10 is incorporated within meter 30, with data transfer between the meter and recorder being established internally. The external hard-wire port 20 is adapted to carry data bidirectionally between recorder 10 and an external modem (not shown), although the modem could alternatively be provided within the meter. The external optical port 16 is available to transfer data to a portable recorder in the same manner as described with respect to FIG. 1a.

Circuitry within recorder 10 is preferably of a high impedance, lower power consumption type, to minimize current drain of battery 28 during power outages. In one embodiment, battery 28 is rechargeable under control of microprocessor circuitry to be hereinafter described, using a programmed control strategy which measures the duration of time that the battery has been discharged under load during a power outage and, based upon the predicted amount of current discharge, calculates the period of time required to fully recharge the battery. In another embodiment, the battery is a nonrechargeable, replaceable, long-life type battery. The detection of the imminent failure of the battery by the battery circuitry 28' (FIG. 13) triggers the storage of the time of day and date of the low battery condition, and the initiation of a communication to the utility to report the condition if a modem is employed.

Figure 2:
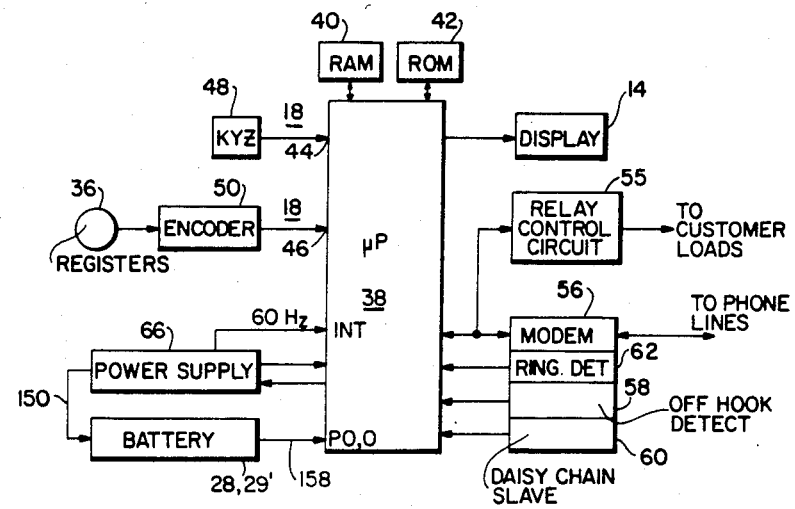
FIG. 2 is a block diagram of the circuitry incorporated in the data recorder of FIGS. 1a and 1b.

Control circuitry incorporated within the recorder 10 preferably in CMOS circuitry based, and may for example, be based upon an 80C31 microprocessor manufactured by INTEL Corporation. A microprocessor of this type, designated as 38 in FIG. 2, includes, on the same substrate, a random access memory (RAM) 40 and a read only memory (ROM) 42 which contains appropriate programming for microprocessor 38, to be hereinafter described. Alternatively, RAM 40 and ROM 42 can comprise separate memory chips which are connected to microprocessor 38. Microprocessor 38 is located on circuit board 22 within housing 12, shown in FIG. 1a. Housing 12 comprises upper and lower portions 12a and 12b which are pivotable on hinge 13, to expose the interior of the housing for maintenance.

Microprocessor 38 receives real time energy demand pulses at its input port 44 from recorder port 18. The pulses, sometimes termed "KYZ" pulses, are generated by a pulse initiator 48 within meter 30. Also received by microprocessor 38 at input 46 (also from recorder port 18) are digitally encoded meter register readings. Whereas the pulses generated by pulse initiator 48 are received by microprocessor 38 continuously and without interrogation, the register encoder 50 is interrogated periodically by microprocessor 38. This is because, as described in detail hereinafter, the register readings are used to verify pulse counts obtained during the demand intervals making up each record. Although only a single meter 30 is in circuit with recorder 10 over lines 34 in FIG. 1 (termed "single channel operation"), it is to be understood that multiple channel operation of recorder 10 is easily provided by proper data partitioning in RAM 40.

Display 14 preferably is a liquid crystal display (LCD) controlled by microprocessor 38 to display summary data, such as time, meter identification number and peak demand as well as total energy usage.

Port 20 is a communication channel that couples data bidirectionally between the microprocessor 38 and a central computer (not shown) over commercial telephone lines. Port 20 is in circuit with a conventional modem 56 controlled by the microprocessor 38 to periodically automatically dial the central computer and transmit to it data stored in RAM 40. Because no transmitting of data over the telephone lines can take place when any telephone extensions at the customer site are off hook, an off hook detector 58 provides that information to the microprocessor 38. Recorder 10 may be daisy chained with a number of other recorders by unit 60 to enable several recorders to transmit data successively over the telephone lines to the central computer. Alternatively, the central computer may poll any of a number of different recorders 10 within a network of such recorders by calling the recorders by telephone successively, preferably at night when telephone use by the customer is unlikely. In this regard, ring detector 62 in response to an incoming call captures the telephone lines to transmit data to the central computer.

A power supply 66 develops trickle charging current to maintain rechargeable battery 28 fully charged when recorder 10 is connected to a source of AC power. Power supply 66 may also supply bias and other operating voltages to microprocessor 38. Alternatively, bias may be applied to microprocessor 38 only by battery 28 which is maintained charged by supply 66. Software for controlling power supply 66 is provided in ROM 42 and is described in detail below.

The data transferred between microprocessor 38 and the central computer via port 20 are formatted with six primary data fields as shown in FIG. 3. The PREAMBLE field identifies the nature of the data being transmitted between recorder 10 and the central computer. Information included in the preamble are the number of channels supported by the recorder, the length of time of the measurement interval associated with the recorder, current memory addresses into which incoming interval counts are to be stored, the interval number within a record and data describing characteristics of the particular recorder in use.

The TIME/IDENTIFICATION field includes an identification number of the recorder, security data to prevent unauthorized data access, the current time as well as the time of the last interrogation of the recorder to identify any unauthorized attempts to access data.

The DIAL-UP field, which enables the recorder 10 to dial a central computer at specified times, contains the telephone number of the central computer with predetermined transmit times or time windows. If communication between the recorder and host computer over the telephone lines during the time window cannot be established because an extension telephone is off-hook as determined by detector 58 (FIG. 2), or for other reasons, transmitting is postponed until a subsequent time window.

The TEST field provides a number of functional tests for the remote recorder 10, including echo back of characters received from the central computer, software debugging and testing of the input port 44 to verify proper operation of pulse initiator 48.

The INTERVAL DATA field, which is of particular significance in this invention, is a data field that identifies the number of pulses received from pulse initiator 48 during each measurement interval (e.g., a fifteen minute interval). A predetermined, fixed number of measurement intervals, e.g., sixty, constitute a record. Microprocessor 38 includes a "real-time" clock which is used to define the duration of each demand interval and a record. Preferably, the real-time clock is periodically synchronized with a clock generated by the central computer whose time is transmitted to the recorder when it is polled by the central computer.

FIG. 4 is a symbolic map of random access memory 40, wherein each storage location contains a byte of data representing the number of pulses generated by initiator 48 during a corresponding interval. The maximum pulse count must be scaled to avoid a pulse overflow in the event that energy demand during any interval is greater than the maximum amount of energy demand expected. Successive measurement interval data are stored in successive addressable storage locations of RAM 40, with a predetermined number of measurement intervals constituting a record, as shown.

At the end of each record interval summary data are used to establish and verify the pulse counts that represent energy demand during successive intervals. Of particular importance among these summary data is data representative of the then current encoded register entry at the end of the record interval. This encoded register data is stored at the end of the data interval record. The encoded register data should correspond to the sum of the pulses contained in all the recorded intervals up through the end of the current record. The encoded register entry thus is a verification that energy demand during the intervals of a record, measured by the pulse initiator 48 and stored in memory 40, appears to be accurate and can be accepted as reliable.

Also contained in each record interval is the current time of the record and, optionally, additional data peculiar to that record and associated with the measurement intervals contained therein.

Still referring to FIG. 3, the ERROR CONDITION field provides information corresponding to error conditions detected in the recorder, such as a low battery condition, a power outage longer than a predetermined duration, a failure of the meter, and the like. Of particular significance in an alternative embodiment disclosed herein is the transmission of information corresponding to the time of day and date at which such error conditions were detected. In particular, the time of day and date of occurrence of the low battery condition is useful to the utility in assessing the reliability of the transmitted demand data. In the event that there have been lengthy or frequent power outages followed by a low battery condition, the utility may elect to disregard the transmitted data and send a utility representative to the customer's site to replace the battery and make a visual reading of the meter dials.

Set forth below is an exemplary report that is generated by the central computer in response to data transmitted to it by recorder 10. The data are categorized by pulses per measurement interval, total accumulated pulses within the current record, corresponding demand in kilowatt-hours, current encoded register readings, as well as an indication, based upon a comparison of encoded register and accumulated pulse readings, whether the two are within a predetermined tolerance band and the interval pulse counts are therefore deemed reliable.

| INTERVAL | 1 | 2 | 3 | 4 ... 60 |
|---|---|---|---|---|
| Pulse count | 200 | 160 | 140 | 130 ... 170 |
| Accum-pulses | 200 | 360 | 500 | 630 ... 12550 |
| Demand (kwh) | 60 | 480 | 420 | 390 ... 510 |
| Register | 196 | 354 | 490 | 620 ... 12400 |
| Verify: | YES | | | |

Figure 5A:
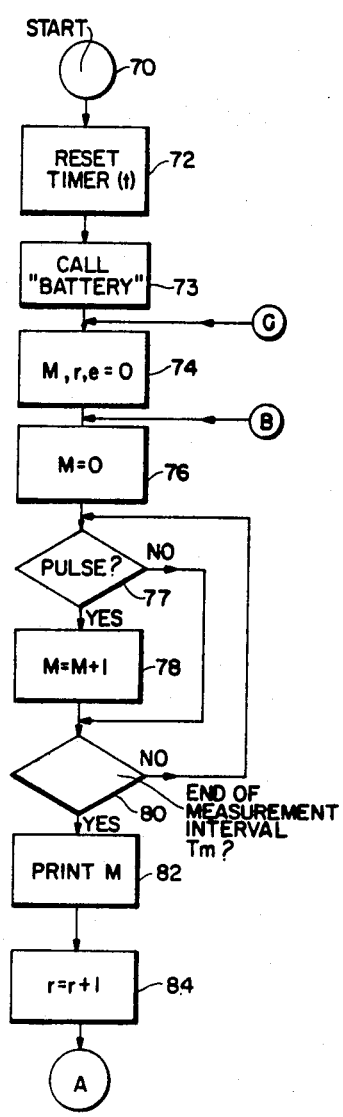
FIGS. 5a-5c are a simplified flow chart of the the steps used for operating the microprocessor of FIG. 2 to control data acquisition.
Figure 5B:
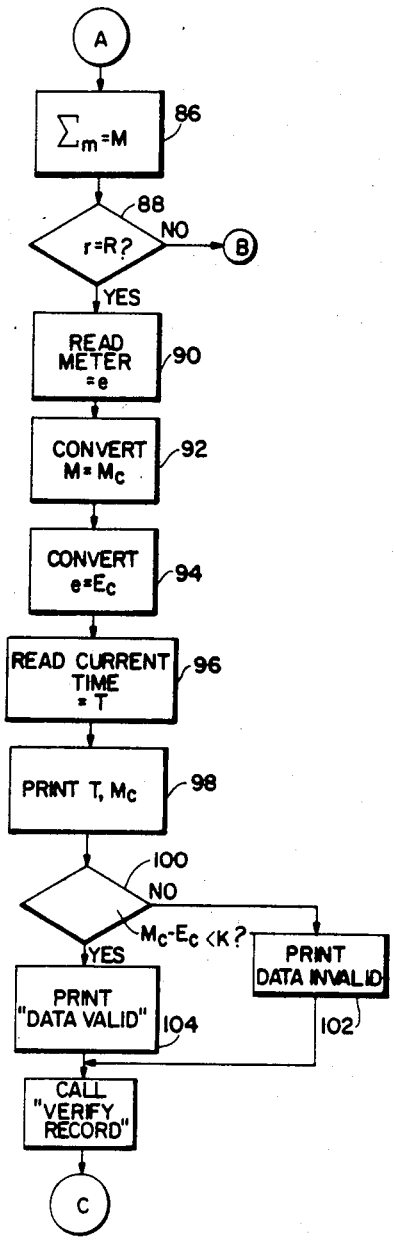
Figure 5C:
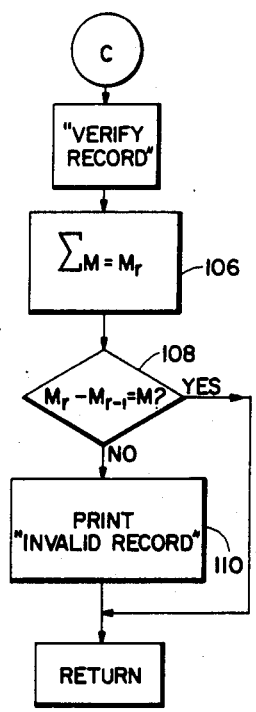

Programming in ROM 42 for controlling microprocessor 38 to store data in RAM 40 as formatted in FIG. 4 and to control the central computer so as to generate some of the data contained in the above report is shown in the flow chart of FIGS. 5a-5c. It is to be understood, however, that all data processing could, if desired, be carried out at the customer site.

As an overview, the program of FIGS. 5a-5c controls microprocessor 38 to count the number of switch closures of pulse initiator 48 that occur during a first interval time $T_m$, records and/or displays the count and repeats these steps for each interval for the duration $T_r$ of a record. The program additionally accumulates pulse counts for all intervals of the record and compares these accumulated pulse counts with an encoded register reading made at the end of the record interval. If the accumulated pulse count corresponds, within a predetermined tolerance window, to the reading of the encoded meter register, the pulses counted during each measurement interval of the record are deemed reliable.

Referring to FIG. 5a, at the beginning of execution of the program at step 70, a timer established by software within ROM 42 is reset (step 72). A subroutine "BATTERY" (step 73) is called if necessary to recharge battery 28. The subroutine shall be described later with reference to FIG. 6. The following software variables are now reset (step 74):
M: accumulated pulse count
r: interval number
e: register reading The variable m representing interval pulse count is next reset (step 76).

Pulses are counted in steps 77 and 78, and at the end of a measurement interval $T_M$, determined in step 80, the interval pulse count m is printed and/or displayed (step 82). This pulse count corresponds to energy demand during the current measurement interval.

The variable r, representing the interval number, is incremented (step 84) and, referring to FIG. 5b, the interval pulse count m is added to any previously accumulated pulse count accumulated during the current record (step 86). In the present example, of course, because the current interval is the first interval of a record, there is no pulse count accumulation.

If the current interval r is not the last interval R of a record (step 88), program execution returns to step 76 to measure and process the next interval pulse count. If, on the other hand, the current interval r is the last interval R of the record, program execution continues to step 90 wherein the digitally encoded output of the meter register 36 is read. The accumulated pulse count M and the encoded register reading e are now converted to compatible units $M_c$, $E_c$ (steps 92 and 94). Current time (e.g. kept by a real-time clock formed as part of microprocessor 38) is read in step 96, and, together with the pulse count for each measurement interval of the current record, printed and/or displayed (step 98). A comparison is now made between the accumulated pulse count M and encoded register reading $E_c$ to determine whether the two are within a predetermined tolerance band k (step 100). If the two data are out of tolerance, the label "data invalid" or similar message is printed and/or displayed (step 102); otherwise, the label "data valid" (step 104) is printed and/or displayed, and in either case, execution of the program, following execution of an optional subroutine "VERIFY RECORD" to be described below, returns to step 76 to accumulate data for the next record interval.

The program can be modified in various ways depending upon the particular report/display format desired. As one example, printing/displaying of the pulse count data during each interval can be inhibited for each interval that the pulse count is deemed during step 100 to be out of tolerance. Additional techniques for confirming that the record obtained by the recorder 10 is reliable can be employed. As one example, with reference to FIG. 5c, during the subroutine "VERIFY RECORD", the number of pulses accumulated from the end of the previous record to the current time is summed (step 106) to obtain a composite sum $M_r$. This composite sum represents the amount of energy demand at the monitored site that has been measured since the time the test was previously initiated. In step 108, the composite sum $M_r$ is compared to the composite sum $M_{r-1}$ (corresponding to energy demand up to but not including the current record) is obtained and compared to the sum M obtained during only the current record. If there is a match, the current record is deemed reliable; otherwise, the label "invalid record" is printed and/or displayed (Step 110) and execution of the program returns to the main program shown in FIGS. 5a, 5b.

Figure 6:
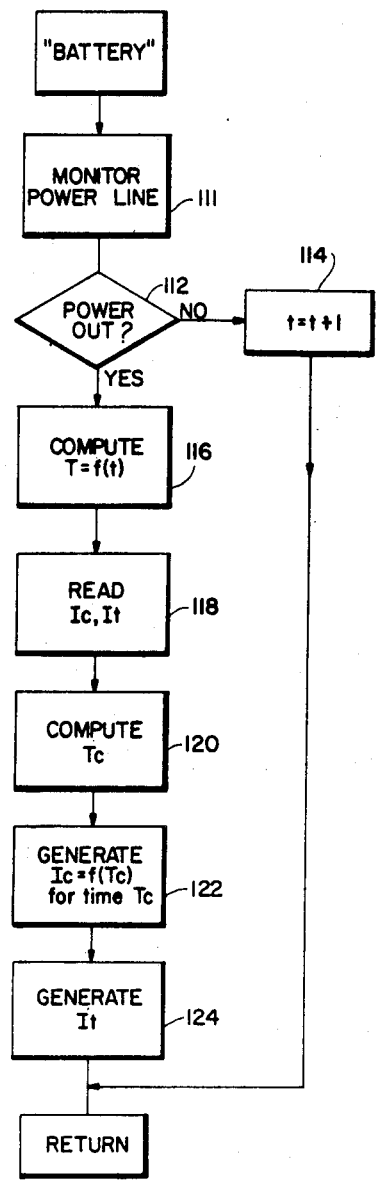
FIG. 6 is a simplified flow chart of software for controlling the microprocessor during charging of the backup battery of FIG. 2.

Turning now to FIGS. 6 and 7, the operation of the battery recharging circuit within power supply 66 (FIG. 2) will be described. In accordance with the control strategy of the invention, and with reference initially to FIG. 7, battery 28 normally is maintained fully charged while recorder 10 is powered by the electrical mains or AC power line by receiving from supply 66 a trickle charge $I_t$, which typically is on the order of 0.1% of the ampere-hour rating of the battery. Battery 28 will become discharged, however, during periods of power outage or when the recorder 10 is intentionally disconnected from the main AC power source, as the battery continues to supply the power required to operate microprocessor 38 and its associated circuitry. In either case, microprocessor 38 measures the time period of the power outage, and when external power is reapplied, the microprocessor calculates the duration of time that a predetermined magnitude of charging current $I_c$ must be applied to battery 28 to fully charge it. Thereafter, at time $T_c$, shown in FIG. 7, the trickle charge mode resumes.

Referring to FIG. 6, the subroutine "BATTERY" called in step 73 of the main program first measures line power (step 111) to determined whether there is a power outage (step 112). If there is a power outage, the duration of the outage is determined by step 116. The values of charging and trickle currents $I_c$, $I_t$, prestored in ROM 40, are read (step 118) and battery 28 is charged (step 120) for the duration of time $T_c$ (step 122) that is calculated during step 120. Thereafter, the microprocessor controls supply 66 to supply to battery 28 trickle charge current $I_t$ until a power outage is again determined to have occurred.

The calculation that is provided in step 120 is a function of the duration of power outage, the discharge current determined by the magnitude of the battery voltage and impedance of its load, and magnitude of the charging current $I_c$. Based on these parameters persons of ordinary skill will be able to develop a factor by which to simply multiply the power outage duration to obtain the appropriate recharge duration $T_c$ for a chosen battery type.

There has been described a solid state data recording device to be installed at a customer site to monitor energy consumption measured by an electricity meter, such as a watthour meter or similar instrument. Interval pulses developed by a standard pulse initiator in the meter are accumulated for each measurement interval of a record, to be transmitted to a central computer for further analysis and/or for billing purposes. The data are verified at two levels. First, counts measured during each interval are accumulated and compared, at the end of each record, to an encoded register reading. If the comparison falls within a predetermined tolerance window, the interval counts are deemed verified. Second, the differences between the counts accumulated for all records and the counts accumulated up to and including only the previous record is compared with the count accumulated for only the current record. If there is a match, the current record is deemed verified.

The recorder is powered by a battery recharged by a microprocessor controlled circuit that measures the time duration of any power outage, and in response, calculates the amount of time that the battery must be recharged to be fully charged, and thereafter, trickle charges the battery.

Figure 8:
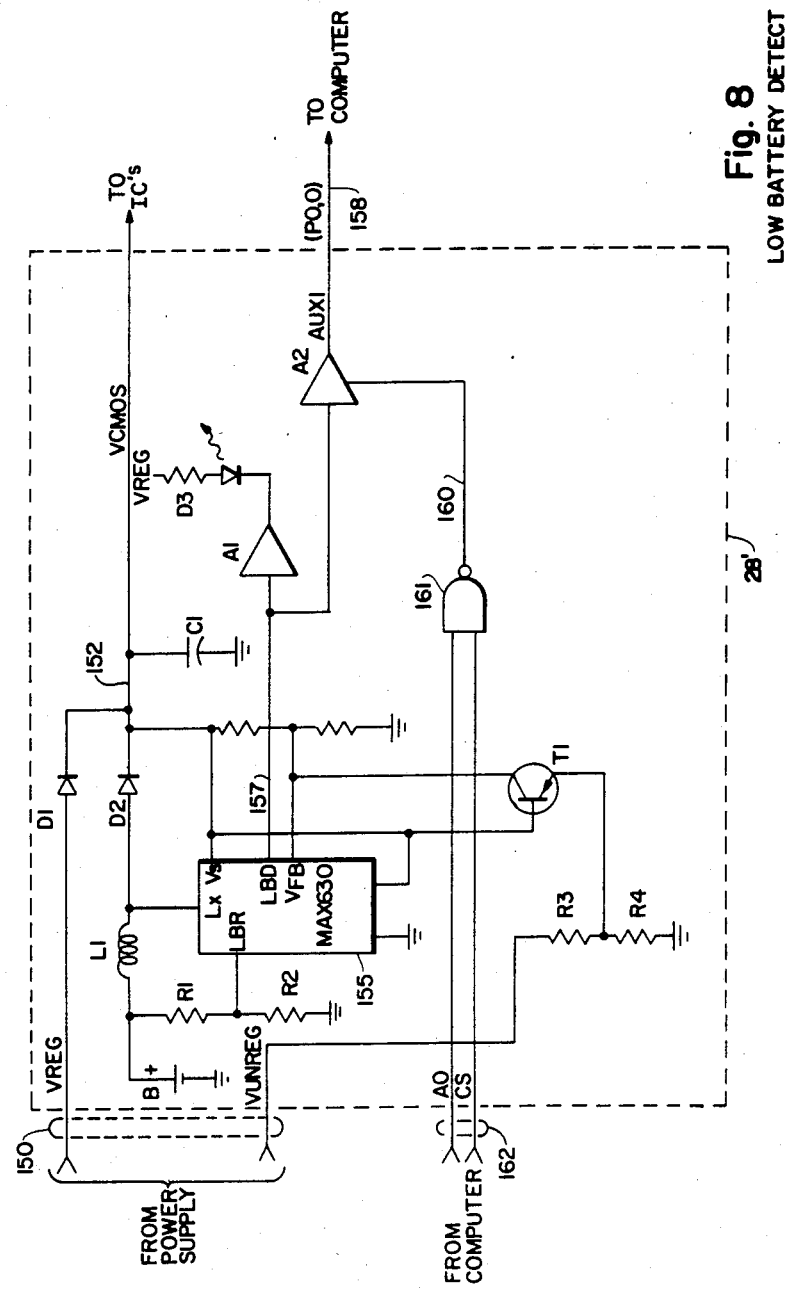
FIG. 8 is a schematic diagram of the low battery detection circuitry employed as the battery circuit shown in FIG. 2.

Next will be described an alternative embodiment of the present invention wherein the recorder detects the occurrence of an error condition and communicates same to the utility central computer for correction. Turning first to FIG. 8, there will first be described an alternative low battery detection circuit 28' which is operative to detect existence of a low battery condition and to signal same to the microcomputer 38. After the detection of the low battery condition by the computer, the microcomputer performs the steps illustrated in FIG. 10 to record the current time of day and date at which the low battery condition occurred, and, if a modem is employed in the data recorder, to report the existence of the condition to the utility central computer, together with the time of day and date.

The low battery detect circuitry 28' receives from the power supply 66 (FIG. 2) two power supply lines on lines 150, a regulated power supply voltage VREG, and an unregulated power supply voltage VUNREG. The regulated voltage VREG is provided from the output of the voltage regulator in the power supply circuit, while the unregulated voltage VUNREG is provided prior to the voltage regulator circuit. The voltage VREG is provided through a diode D1 to a node 152, which serves as the point of origin of the stepped up voltage VCMOS for powering the MOS circuitry employed in the disclosed embodiment.

For detecting the low battery condition and for stepping up the voltage to the level required for the MOS circuitry, a step up switching regulator 155 is employed. This regulator 155 is a type MAX 630 step up switching regulator manufactured by Maxim Integrated Products, of Sunnyvale, Calif. The battery B employed as the auxiliary or back-up power supply has its positive terminal (+) connected through a flyback inductor L1 to the flyback input $L_X$ of the switching regulator 155, and through a diode D2 to the node 152. It will be appreciated that power from the battery B will provide the voltage VCMOS for powering the microcomputer and other circuitry in the event that diode D1 becomes reverse-biased; this will occur if the voltage VREG falls below the cutoff of the diode, as during a power outage.

The positive terminal (+) of the battery B is also connected through a voltage divider comprising resistors R1, R2 to the low battery input LBR of the regulator 155. The magnitudes of the resistors R1, R2 are selected such that a voltage below a predetermined magnitude appears at the LBR input when the voltage of the battery B falls below a selected predetermined threshold magnitude indicative of imminent battery failure. The requirements for this voltage level are contained in the literature supplied by the manufacturer. For example, for a 3 volt battery, if the battery falls below 2.4 volts, the internal comparator in the regulator 155 will become operative to indicate a low battery condition.

A low battery detect condition is indicated by a signal on line 157 from the LBD output of the regulator 155. This signal is provided through an amplifier A1, which powers a light emitting diode (LED) D3, to provide a visual indication of battery failure. It will be understood that the LED will be illuminated only during such times as there is not a power outage.

The low battery detect signal on line 157 is also provided a buffer amplifier A2 as the signal AUX1. The signal AUX1 is provided to one of the input ports lines P0, 0 of the microcomputer 38 on line 158 so that the computer may detect the occurrence of the low battery condition under program control. Amplifier A2 provides the low battery detect input signal AUX1 when enabled under program control. Thus, the amplifier A2 is preferably a type 14503 CMOS tri-state driver manufactured by Motorola, Inc., Phoenix, Ariz., or the like. The amplifier A2 is enabled under program control on provision of a signal on line 160 from a NAND gate 161.

The inputs to the NAND gate 161 are provided on lines 162 from addressing circuitry associated with the microcomputer 38: the A0 address line and a chip select signal CS. Construction of addressing and chip selection circuitry for a microcomputer circuitry is within the skill of the art. It will therefore be appreciated that the microcomputer 38 can read the input AUX1 under program control, and can therefore detect the occurrence of the low battery condition.

A PNP transistor T1, and resistors R3, R4 provide means for shutting off the regulator 155 to prevent battery drain while AC power is on. When the node between R3 and R4 is pulled above VCMOS by VUNREG, T1 turns on, causing the voltage at the input $V_{FB}$ of the regulator 155 to rise. This turns off the regulator. Resistors R3, R4 are selected to cause the shutoff to occur at a particular desired VUNREG voltage.

Turning to FIG. 9, next will be described the preferred software routine employed in the alternative embodiment described above for detecting the occurrence of the low battery condition and responding to same. It will of course be understood that the microcompter 38 includes a primary program flow loop which employs a variety of subroutines to accomplish the functions hereinabove described and to be described next. In the preferred embodiment, pulses from the power supply 66 (FIG. 2) at the line frequency of 60 Hertz (Hz) are provided to the interrupt (INT) input of the microcomputer 38. Those skilled in the art will therefore understand that each 60 Hz power line cycle causes the microcomputer to execute an interrupt handling routine which registers the fact of occurrence 60 Hz cycle, examines other inputs to the microcomputer, and performs other data processing tasks as herein described.

It should be understood that the sequence of steps to be described next are executed in response to the interrupt generated by the 60 Hz cycle. Referring first to FIG. 9, the steps for detecting the occurrence of low battery condition will be described. It should first be understood that the microcomputer 38 is receptive to commands from the utility central computer when communications have been established between the central computer and the microcomputer 38 over telephone lines through modem 56. In the alternative preferred embodiment now being described, there is a need to prevent repetitive signaling of the low battery condition. Accordingly, there is provided a software flag denominated AUXENB, for "auxiliary enable", which is set only on command from the central computer. This flag is only set by the central computer when it is desired to monitor for a low battery condition.

Thus, at step 200, the first inquiry made by microcomputer 38 in response to entry of this routine is to examine the AUXENB flag. If this flag has not been set by the central computer, the routine of FIG. 9 exists, thereby preventing indication of the low battery condition.

If the AUXENB flag is set, the microcomputer reads the input AUX1, it being recalled that AUX1 corresponds to indication of the low battery error condition. If no low battery condition is detected (step 202), this routine exits. If however a low battery condition is detected, the current time of day and date is stored in a memory location denominated LOBAT TIME (step 203). Then, the AUXENB flag is cleared and a software flag signaling the low battery condition, LOBAT, is set (step 204). Automatically, the low battery indicator LED D3 is illuminated, provided that power is being provided from the AC line source.

If the data recorder system is configured with a modem, the routine can then call the communications module, denominated here as COMM, so that a communication may be initiated to advise the central computer of the low battery condition (step 206). Alternatively, the low battery condition may be treated as another type of error condition, and the steps of FIG. 10 taken. Otherwise, the time of day and date of occurrence of the low battery condition is maintained in memory until the data is read through the portable data retriever/recorder 32.

It will now be appreciated that information corresponding to the time of day and date of occurrence of the low battery condition allows the utility central computer to associate the occurrence of the low battery condition with power outages which may have occurred close in time to the low battery condition. Advantageously, therefore, the utility can assess the reliability of the demand data based on the time differential between the receipt of the demand data, the occurrence of the low battery condition, and the number and length of power outages which may have occurred.

Turning next to FIG. 10, upon the completion of the steps illustrated in FIG. 9 the microcomputer 38 may execute steps for initiating a communication to the utility central computer, indicated as the CALL HOME routine, in response to detection of other error conditions. As has been described earlier, it is considered an error condition if a power outage occurred or the customer's electrical demand as indicated by the KYZ pulses goes to zero. Of course, the electrical demand could be zero for various reasons including regularly scheduled outages for maintenance and the like; however, regularly scheduled down times will be known at the central office ahead of time. In addition, power outages of a few cycles are not uncommon in many electrical utilities, due to substation and generator facility switching. However, if a power outage longer than a predetermined time period occurs, for example 1 hour, then it is most likely that the outage is due to an error condition.

It will therefore be understood that the preferred alternative embodiment disclosed herein maintains timing routines for purposes of detecting actual power outages and malfunctions in the electric metering equipment. It will be recalled that the program steps being described are executed in response to an interrupt generated by the 60 Hz line frequency. At the end of each of these interrupt handling routines, a timer is initiated for purposes of measuring the time until the next 60 Hz interrupt.

Additionally, the microcomputer 38 maintains an internal clock or timer for purposes of measuring time. Since many of the routines are dependent upon execution at approximately 60 Hz execution frequency, a power outage can be detrimental to program operation. Thus, the internal clock or timer automatically triggers an interrupt or trap at a predetermined time interval approximately the same as the 60 Hz line frequency (slightly longer to allow for tolerance); the internal interrupt is disabled if the 60 Hz line interrupt occurs when expected. Also, after receipt of a KYZ pulse, an interval timer is set to detect the occurrence of the next KYZ pulse within a predetermined time window.

With the foregoing in mind, in FIG. 10 the first step taken (step 210) is to read the contents of the 60 Hz internal and external timer and the KYZ timer. The 60 Hz internal timer is the internal clock, while the external timer measures the interval between 60 Hz interrupts. The KYZ timer measures the interval between KYZ pulses. A power outage will be indicated (step 212) if there has been an elapsed time more than 1/60 second plus X (where X is a predetermined amount of time allowed for frequency tolerance) since the last 60 Hz interrupt. If more than 1/60 second plus X, a power outage has occurred, and a flag indicative of the power outage, denominated OUTAGE, is set (step 213). It will therefore be appreciated that a power outage can be accurately detected since the combination of the internal and external timing insures that interrupts caused by the 60 Hz line frequency are detected and employed to reset the timing routines, but that if too much time elapses until the next cycle (plus a tolerance amount), the outage error condition will be indicated.

In a similar manner, the time elapsed since the last KYZ pulse is examined (step 215). If more than a predetermined elapsed time has passed, say Y seconds, then an error condition exists such as a malfunction in the meter, which has prevented the occurrence of KYZ pulses. An error condition flag denominated PULSES is set (step 217) in this situation; otherwise, the routine exits.

Next, the error condition is communicated to the utility central computer. The PULSES, OUTAGE, and LOBAT flags are examined (step 220), and if any of these flags are set, the modem, if present, is activated and the error condition is reported to the utility central computer (step 221).

It will now be appreciated that the existence of the error condition is detected and reported so that a low battery can be replaced, or a malfunctioning meter can be repaired or replaced, or other action taken in response to a power outage.

Figure 11:
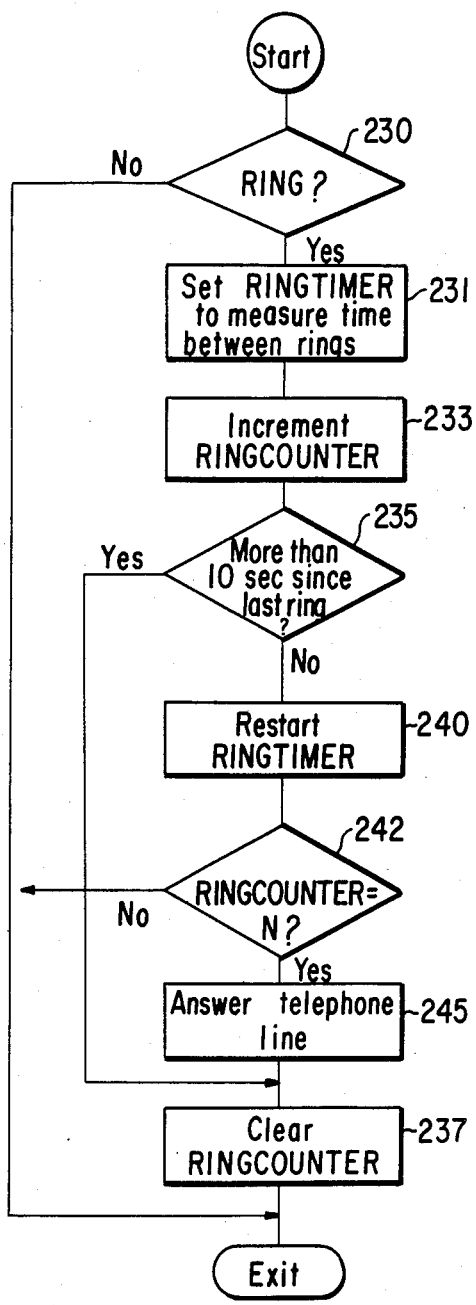
FIG. 11 is a simplified flow chart of the software for rendering the data recorder responsive to a utility central computer initiated communication.

Turning next to FIG. 11, it will be recalled that another object of the present invention is to provide an "override" function for the data recorder so that the data recorder is receptive to commands from the utility central computer at times other than the normal data downloading time. It will also be recalled from the discussion above that the normal operation of the disclosed embodiment is to initiate a communication to the utility central computer during "off" hours when the customer telephone line is least likely to be in use. Only when a connection has been established after the system has initiated the communication is the microcomputer receptive to commands from the utility central computer. As will next be described, means for overriding the normal operation are provided in the alternative disclosed embodiment.

The basic technique employed to override normal operation of the data recorder is to detect a predetermined number of rings being received over the telephone line. This predetermined number is usually selected as a number of rings beyond that which normal perople will answer, for example, 12 or more rings.

Preferably, the communication is initiated by the utility central computer when the customer's facilities are expected to be unoccupied, for example during the late evening hours. Of course, in the event that the telephone is answered by a person in attendance prior to the indicated number of rings, the central computer system can detect that a connection was not made and retry the communication at a later time.

Accordingly, the first step taken by the microcomputer 38 in FIG. 11 is to detect the indication of a ringing condition on the telephone line (step 230). As known to those skilled in the art, most commercially available modems provide a ring detect output for this purpose. Of course, if no ringing condition is detected, the remaining steps in FIG. 11 are not executed and the routine exits. If a ringing condition is detected, a timer variable denominated RINGTIMER is set for measurement of the time between rings (step 231). A count of the number of rings is incremented, by incrementing a variable denominated RINGCOUNTER for this purpose (step 233).

Examining the RINGTIMER variable (step 235), if more than m seconds, say 10, has elapsed since the last ring, it is indicated that a subsequent, second call is now being received over the telephone line, and the RINGCOUNTER is cleared to begin counting rings again in anticipation of a communication from the central computer (step 237). This is to insure that consecutive, closely-spaced calls over the telephone line do not cause a connection to the data recorder modem when in fact a call for the customer is being received over the telephone line.

If after step 235 more than m seconds since the last ring has not elapsed, the RINGTIMER is restarted for measurement of the time between rings (step 240). This is in anticipation of re-entry of the routine and inquiry at step 235 on the next pass. The value of RINGCOUNTER is examined, and if the RINGCOUNTER has reached a predetermined number N, for example 12 or more (step 242), the telephone line is answered (step 245) by the modem, and communications are established between the utility central computer and the microcomputer 38. If a sufficient number N of rings have not been counted, then the routine exits with the variables being set up for the next pass through the routine to detect whether the telephone is to be answered.

It will now be understood that the sequence of steps described above renders the data recorder receptive to receipt of commands from the utility central computer at any time, for example for downloading load management commands. If the meter/data recorder includes relay control circuits such as indicated at 55 in FIG. 2, the microcomputer can actuate these relays to control load removal for peak load management functions.

Figure 12:
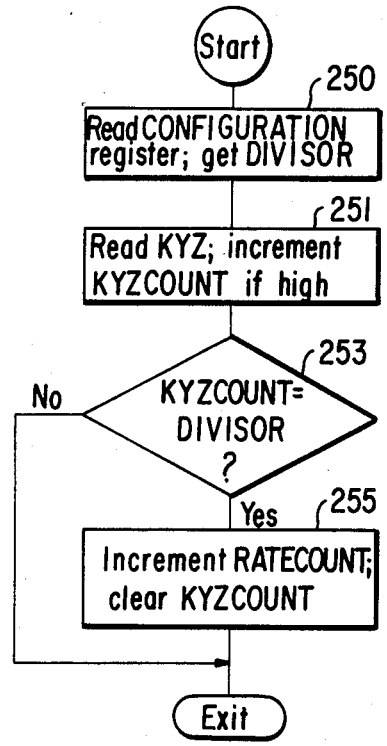
FIG. 12 is a simplified flow chart of the software for programmably configuring the data recorder for operation over a wide range of customer demands.

Turning now to FIG. 12, next will be described a routine which enables the alternative disclosed embodiment described herein to operate over a wide range of KYZ pulse input frequencies and variable interval lengths. As discussed above, it has been a problem in electrical demand data recorders in providing a single recorder which can operate over a wide range of customer usage rates. It will be of course understood that low electrical usage rates result in low frequencies of KYZ pulses, while conversely high usage produces high frequencies of KYZ pulses. In high usage applications, it has been discovered that the memory capacity of solid state recorder quickly reaches exhaustion. In addition, different utility customers may demand different measurement intervals. While solid state memories have been rapidly decreasing in cost, redesign of the hardware to employ new circuitry to compensate for variable interval lengths or high KYZ pulse frequencies is costly and requires modification of existing customer equipment.

In accordance with an aspect of the present invention, the KYZ input frequency is scaled in accordance with command instructions by the central computer, or alternatively by the setting of programmable switches provided in the recorder 10. Accordingly, it will be understood that a register or memory location is provided in the microcomputer 38 for maintaining data indicative of the recoder's configuration. This register may be a memory location which may be loaded remotely by the utility central computer via the communications link, or alternatively may be a DIP switch bank which can be read under program control by the microcomputer 38. In either situation, the configuration register will contain a divisor which is used to scale the input frequency.

Beginning at step 250 in FIG. 12, the first step is to read the configuration register to obtain the divisor. Upon the occurrence of the KYZ pulse, a variable denominated KYZCOUNT is incremented (step 251) upon each occurrence of the KYZ pulse. When the KYZCOUNT equals the divisor (step 253), a variable denominated RATECOUNT is incremented and the KYZCOUNT is cleared (step 255). The variable RATECOUNT then represents the number of occurrences of the KYZ pulse. Inasmuch as the division factor represented by the divisor is either known to the utility central computer by virtue of its having programmed the divisor remotely, or by virtue of the configuration information having been provided the central computer at a set up time if configuration switches are employed, it is a simple matter to program the utility central computer to treat the record of demand data being provided as a scaled record which represents a higher usage rate. It will therefore be understood and appreciated that the foregoing steps allow the meter to be employed in customer facilities having widely ranging electrical utility demand rates without the need for different hardware. It will also be appreciated that the divisor stored in the configuration register can be changed by the utility central computer in response to changing electrical usage of a customer, by changing the divisor with a command during a communication between the data recorder and the central computer.

It will now be appreciated that there has been described a solid state data recording device to be installed at a customer's site to monitor energy consumption measured by the electricity meter which is operative to detect error conditions in the operation of the meter or recorder such as power outages, low battery condition, and the like, and to communicate the fact of the error condition to the utility central computer. Information corresponding to the time of day and date at which the error condition occurred is also stored to facilitate an assessment's of the reliability of the customer's usage data record. There has been further described a system for accumulating energy demand data from a remote electricity meter which is receptive to control commands from a central computer such as a KYZ pulse frequency scaling divisor or a command to enable the system for detection of a low battery condition. Additionally, the described system is responsive to a communication initiated by the utility central computer to receive commands at times other than preprogrammed communication times, for purposes of providing remote commands or for downloading customer demand data.

It will be apparent that the embodiments shown herein are only exemplary, and that various modifications can be made that are within the scope of the invention as defined in the following claims.

What is claimed is:

1. A system for accumulating energy demand data from an electricity meter of a type having means for generating pulses corresponding to a demand rate comprising:

means for detecting pulses generated by said meter;

means for counting the pulses detected by said detecting means during a predetermined measurement interval to develop demand data;

memory means for storing said demand data during predetermined time intervals;

means for transmitting stored demand data from said memory means to a central computer over a telephone line at periodic time intervals;

error condition detecting means for detecting the existence of an eror condition in said system, said error condition corresponding to a meter error, and further comprising timing means responsive to pulses detected by said detecting means for indicating said meter error in response to the failure by said detecting means to detect a pulse within a predetermined time period, and means responsive to said error condition for transmitting information corresponding to said error condition to said central computer over said telephone line.

2. A system for accumulating energy demand data from an electricity meter of a type having means for generating pulses corresponding to a demand rate, comprising:

means for detecting pulses generated by said meter;

means for counting the pulses detected by said detecting means during a predetermined measurement interval to develop demand data;

memory means for storing said demand data during predetermined time intervals;

means for transmitting stored demand data from said memory means to a central computer over a telephone line at periodic time intervals;

an auxiliary battery power supply for supplying power to the system;

error condition detecting means for detecting the existence of an error condition in said system, said error condition corresponding to a low battery condition of said auxiliary battery power supply, and further comprising low battery circuit means for detecting when the output voltage of said auxiliary battery power supply falls below a predetermined threshold magnitude and for providing a low battery signal to signal said error condition; and means responsive to said error condition for transmitting information corresponding to said error condition to said central computer over said telephone line.

3. The system of claim 2, further comprising clock means for maintaining time data corresponding to the current time of day and date, and memory means for storing time data corresponding to the time of day and date at which said low battery circuit means provides said low battery signal, and wherein said transmitting means transmits said stored time data to said central computer.

4. The system of claim 3, wherein said transmitting means is operative to automatically dial said central computer in response to said low battery signal.

5. The system of claim 2, further comprising command means for receiving control commands from a central computer over telephone lines.

6. The system of claim 5, further comprising enabling means for rendering said low battery circuit means operative, and wherein said enabling means is responsive to a command received by said command means for rendering said low battery circuit operative.

7. The system of claim 6, wherein said enabling means is rendered inoperative by said low battery signal, whereby said low battery circuit is not rendered operative until a new command from said central computer after correction of the low battery condition.

8. A system for accumulating energy demand data from an electricity meter of a type having means for generating pulses corresponding to a demand rate, comprising:
   means for detecting pulses generated by said meter;
   means for counting the pulses detected by said detecting means during a predetermined measurement interval to develop demand data;
   memory means for storing said demand data during predetermined time intervals;
   means for transmitting stored demand data from said memory means to a central computer over a telephone line at periodic time intervals;
   error condition detecting means for detecting the existence of an error condition in said system, said error condition corresponding to a power outage, and further comprising outage detecting means for detecting the occurrence of a power outage comprising means responsive to the power line frequency for timing the interval between power line cycles, and means responsive to the timing means to provide a power outage signal in response to the failure of said timing means to detect a power line cycle within a predetermined maximum time period; and
   means responsive to said error condition for transmitting information corresponding to said error condition to said central computer over said telephone line.

9. The system of claim 8, wherein said maximum time period corresponds to a predetermined number n of power line cycles, whereby power outages less than a particular predetermined time do not cause an indication of a power outage.

10. A system for accumulating energy demand data from an electricity meter of a type having means for generating pulses corresponding to a demand rate, comprising:
    means for detecting pulses generated by said meter;
    means for counting the pulses detected by said detecting meand during a predetermined measurement interval to develop demand data;
    memory means for storing said demand data during predetermined time intervals;
    means for transmitting stored demand data from said memory means to a central computer over a telephone line at periodic time intervals;
    error condition detecting means for detecting the existence of an error condition in said system, said error condition corresponding to a power outage, and further comprising outage detecting means for detecting the occurrence of a power outage, and an auxiliary battery power supply for supplying power to said system during said power outage; and
    means responsive to said error condition for transmitting information corresponding to said error condition to said central computer over said telephone lines, wherein said transmitting means is operative to transmit information corresponding to the detection of said outage condition after restoration of power to avoid power drain on said auxiliary battery power supply during said outage.

11. A system for accumulating energy demand data from an electricity meter of a type having means for generating pulses corresponding to a demand rate, comprising:
    means for detecting pulses generated by same meter;
    means for counting the pulses detected by said detecting means during a predetermined measurement interval to develop demand data;
    memory means for storing said demand data during predetermined time intervals;
    means for transmitting stored demand data from said memory means to a central computer over a communications channel at periodic time intervals;
    error condition detecting means for detecting the existence of an error condition in said system, said error condition corresponding to a meter error, and further comprising timing means responsive to pulses detected by said detecting means for indicating said meter error in response to the failure by said detecting means to detect a pulse within a predetermined time period; and
    means responsive to said error condition for transmitting information corresponding to said error condition to said central computer over said communications channel.

12. A system for accumulating energy demand data from an electricity meter of a type having means for generating pulses corresponding to a demand rate, comprising:
    means for detecting pulses generated by said meter;
    means for counting the pulses detected by said detecting means during a predetermined measurement interval to develop demand data;
    memory means for storing said demand data during predetermined time intervals;
    means for transmitting stored demand data from said memory means to a central computer over a communications channel at periodic time intervals;
    an auxiliary battery power supply for supplying power to the system;
    error condition detecting means for detecting the existence of an error condition in said system, said error condition corresponding to a low battery condition of said auxiliary batery power supply, and further comprising low battery circuit means for detecting when the output voltage of said auxiliary battery power supply falls below a predetermined threshold magnitude and for providing a low battery signal to signal said error condition; and
    means responsive to said error condition for transmitting information corresponding to said error condition to said central computer over said communications channel.

13. The system of claim 12, further comprising clock means for maintaining time data corresponding to the current time of day and date, and memory means for storing time data corresponding to the time of day and date at which said low battery circuit means provides said low battery signal, and wherein said transmitting means transmits said stored time data to said central computer over said communications channel.

14. The system of claim 13, wherein said transmitting means is operative to automatically communicate with said central computer in response to said low battery signal.

15. The system of claim 12, further comprising command means for receiving control commands from a central computer over said communications channel.

16. The system of claim 15, further comprising enabling means for rendering said low battery circuit means operative, and wherein said enabling means is responsibe to a command received by said command means for rendering said low battery circuit operative.

17. The system of claim 16, wherein said enabling means is rendered inoperative by said low battery signal, whereby said low battery circuit is not rendered operative until a new command from said central computer after correction of the low battery condition.

18. A system for accumulating energy demand data from an electricity meter of a type having means for generating pulses corresponding to a demand rate, comprising:
   means for detecting pulses generated by said meter;
   means for counting the pulses detected by said detecting means during a predetermined measurement interval to develop demand data;
   memory means for storing said demand data during predetermined time intervals;
   means for transmitting stored demand data from said memory means to a central computer over a communications channel at periodic time intervals;
   error condition detecting means for detecting the existence of an error condition in said system, said error condition corresponding to a power outage, and further comprising outage detecting means for detecting the occurrence of a power outage including means responsive to the power line frequency for timing the interval between power line cycles, and means responsive to the timing means provide a power outage signal in response to the failure of said timing means to detect a power line cycle within a predetermined maximum time period; and
   means responsive to said error condition for transmitting information corresponding to said error condition to said central computer over said communications channel.

19. The system of claim 18, wherein said maximum time period corresponds to a predetermined number n of power line cycles, whereby power outages less than a particular predetermined time do not cause an indication of a power outage.

20. A system for accumulating energy demand data from an electricity meter of a type having means for generating pulses corresponding to a demand rate, comprising:
   means for detecting pulses generated by said meter;
   means for counting the pulses detected by said detecting means during a predetermined measurement interval to develop demand data;
   memory means for storing said demand data during predetermined time intervals;
   means for transmitting stored demand data from said memory means to a central computer over a communicaions channel at periodic time intervals;
   error condition detecting means for detecting the existence of an error condition in said system, said error condition corresponding to a power outage, and further comprising outage detecting means for detecting the occurrence of a power outage, and an auxiliary battery power supply for supplying power to said system during said power outage; and
   means responsive to said error condition for transmitting information corresponding to said error condition to said central computer over said communications channel, wherein said transmitting means is operative to transmit information corresponding to the detection of said outage condition after restoration of power to avoid power drain on said auxiliary battery power supply during said outage.

* * * * *